United States Patent
Son et al.

(10) Patent No.: US 9,704,938 B2
(45) Date of Patent: Jul. 11, 2017

(54) ORGANIC LIGHT EMITTING DIODE DISPLAY

(71) Applicant: SAMSUNG DISPLAY CO., LTD., Yongin, Gyeonggi-Do (KR)

(72) Inventors: Se wan Son, Yongin-si (KR); Young Woo Park, Seongnam-si (KR); Min Woo Woo, Bucheon-si (KR); Wang Woo Lee, Osan-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 8 days.

(21) Appl. No.: 14/811,088

(22) Filed: Jul. 28, 2015

(65) Prior Publication Data

US 2016/0204182 A1    Jul. 14, 2016

(30) Foreign Application Priority Data

Jan. 9, 2015 (KR) .......................... 10-2015-0003530

(51) Int. Cl.
*H01L 27/32* (2006.01)

(52) U.S. Cl.
CPC ...... *H01L 27/3276* (2013.01); *H01L 27/3262* (2013.01); *H01L 27/3265* (2013.01)

(58) Field of Classification Search
CPC ............ H01L 51/0545; H01L 51/0036; H01L 51/0541; H01L 51/5012
See application file for complete search history.

(56) References Cited

U.S. PATENT DOCUMENTS

| 7,864,254 B2 * | 1/2011 | Kim ................. G02F 1/136204 257/347 |
| 2014/0084293 A1 | 3/2014 | Ahn et al. |
| 2016/0148985 A1 * | 5/2016 | Park .................... H01L 27/3262 257/40 |

FOREIGN PATENT DOCUMENTS

| JP | 2011-520138 A | 7/2011 |
| KR | 2002-0062276 A | 7/2002 |
| KR | 2014-0018623 A | 2/2014 |

* cited by examiner

*Primary Examiner* — Quoc Hoang
(74) *Attorney, Agent, or Firm* — Lee & Morse, P.C.

(57) ABSTRACT

Disclosed herein is an organic light emitting diode display, including: a first thin film transistor including a first active pattern positioned on the substrate and a first gate electrode positioned on the first active pattern; a third thin film transistor including a third active pattern connected to the other end of the first active pattern and a third gate electrode positioned on the third active pattern; and a gate bridge directly connecting between the third active pattern and the first gate electrode and positioned between the substrate and the third active pattern.

18 Claims, 3 Drawing Sheets

ORGANIC LIGHT EMITTING DIODE DISPLAY

CROSS-REFERENCE TO RELATED APPLICATION

Korean Patent Application No. 10-2015-0003530, filed on Jan. 9, 2015, in the Korean Intellectual Property Office, and entitled: "Organic Light Emitting Diode Display," is incorporated by reference herein in its entirety.

BACKGROUND

1. Field

Embodiments relate to an organic light emitting diode display.

2. Description of the Related Art

Generally, as a representative example of a flat panel display, there are an organic light emitting diode display, a liquid crystal display, and a plasma display panel, and the like.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode display, including a substrate, a first thin film transistor including a first active pattern positioned on the substrate and a first gate electrode positioned on the first active pattern, a second thin film transistor including a second active pattern connected to one end of the first active pattern and a second gate electrode positioned on the second active pattern, a data line positioned on the second gate electrode and connected to the second active pattern through a contact hole, a third thin film transistor including a third active pattern connected to another end of the first active pattern and a third gate electrode positioned on the third active pattern, a gate bridge directly connecting between the third active pattern and the first gate electrode and positioned between the substrate and the third active pattern, and an organic light emitting diode connected to the first active pattern.

The gate bridge may directly connect to the third active pattern and may be connected to the first gate electrode through the contact hole.

The organic light emitting diode display may further include a contact pattern positioned inside the contact hole and contacting the first gate electrode and the gate bridge, respectively.

The contact pattern may be positioned on a same layer as the data line.

The organic light emitting diode display may further include a reinforcement pattern positioned between the substrate and the second active pattern, corresponding to the contact hole.

The reinforcement pattern may directly contact the second active pattern.

The reinforcement pattern may be positioned on a same layer as the gate bridge.

The organic light emitting diode display may further include a first scan line positioned on the second active pattern, crossing the second active pattern and the third active pattern, respectively, and connected to the second gate electrode and the third gate electrode; and a driving power supply line crossing the first scan line, being adjacent to the data line on the first scan line and connected to the first active pattern.

The organic light emitting diode display may further include a capacitor electrode connected to the driving power supply line to be positioned on the first gate electrode and forming the capacitor together with the first gate electrode, overlapping the first gate electrode.

The first gate electrode and the capacitor electrode may each be made of metal.

The first active pattern, the second active pattern, and the third active pattern may each be positioned on a same layer, and the data line and the driving power supply line may each be positioned on a same layer.

The organic light emitting diode display may further include a fourth thin film transistor connected to the third active pattern and including a fourth active pattern connected to the first gate electrode through the gate bridge and a fourth gate electrode positioned on the fourth active pattern, a second scan line positioned on the fourth active pattern to cross the fourth active pattern and connected to the fourth gate electrode, and an initialization power supply line connected to the fourth active pattern.

The first gate electrode, the second gate electrode, the third gate electrode, the fourth gate electrode, the first scan line, and the second scan line may each be positioned on a same layer.

The organic light emitting diode display may further include a fifth thin film transistor including a fifth active pattern connecting between the first active pattern and the driving power supply line and a fifth gate electrode positioned on the fifth active pattern, a sixth thin film transistor including a sixth active pattern connecting between the first active pattern and the organic light emitting diode and a sixth gate electrode positioned on the sixth active pattern, and an emission control line positioned on the fifth active pattern and the sixth active pattern, respectively, to cross the fifth active pattern and the sixth active pattern, respectively, and connected to the fifth gate electrode and the sixth gate electrode, respectively.

The first gate electrode, the second gate electrode, the third gate electrode, the fourth gate electrode, the fifth gate electrode, the sixth gate electrode, and the emission control line may each be positioned on a same layer.

The organic light emitting diode display may further include a seventh thin film transistor including a seventh active pattern connected to the fourth active pattern and a seventh gate electrode positioned on the seventh active pattern, and a third scan line positioned on the seventh active pattern to cross the seventh active pattern and connected to the seventh gate electrode.

The third scan line may be the same line as the second scan line.

A channel region of the first active pattern overlapping the first gate electrode may extend with one or more bends.

BRIEF DESCRIPTION OF THE DRAWINGS

Features will become apparent to those of skill in the art by describing in detail example embodiments with reference to the attached drawings in which.

DETAILED DESCRIPTION

Figure 1:
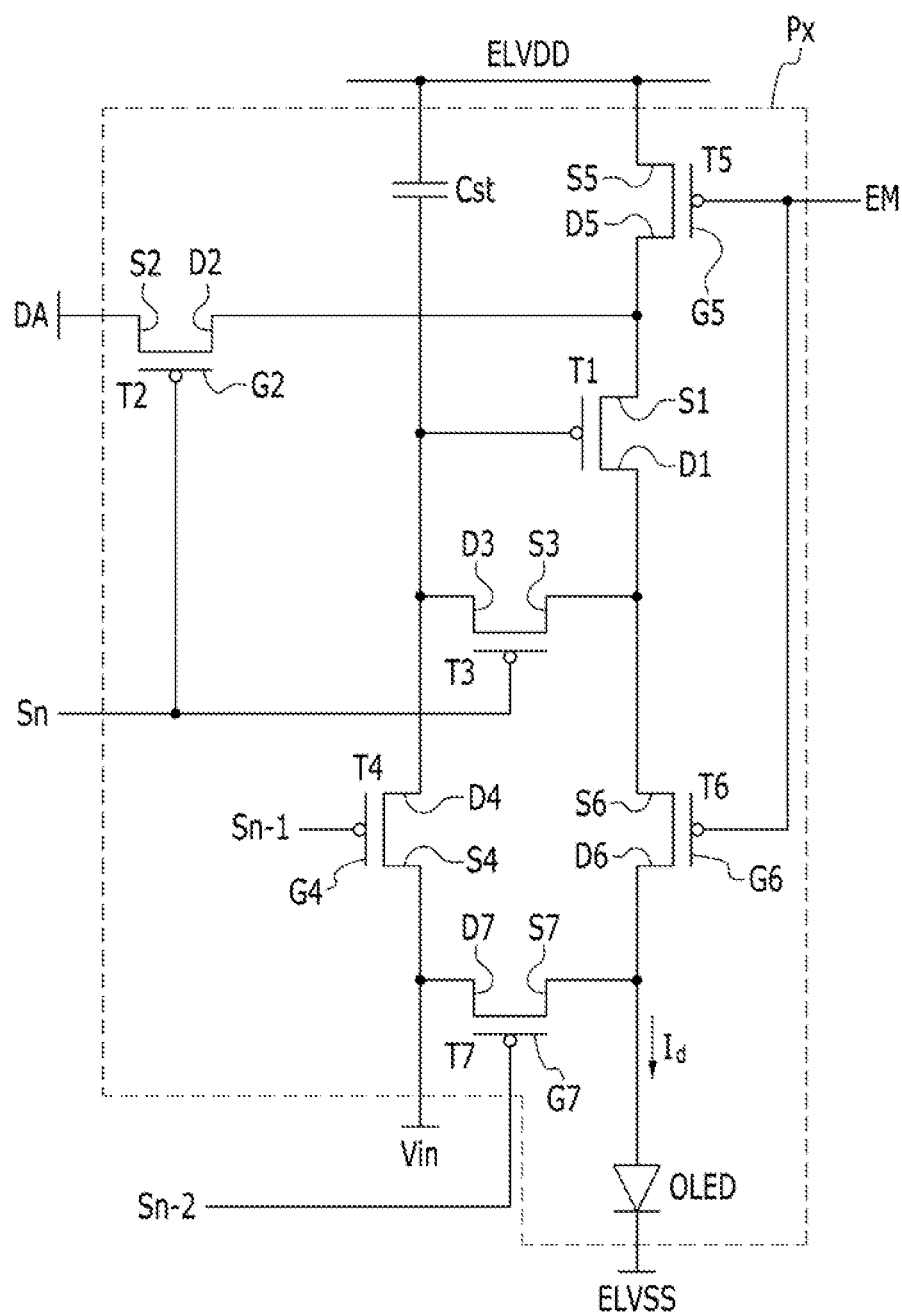
FIG. 1 illustrates a circuit diagram illustrating a pixel of an organic light emitting diode display according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element such as a layer, a film, a region, or a plate is referred to as being "on" another element, it may be directly on another element or may have an intervening element present therebetween.

In addition, unless explicitly described to the contrary, the word "comprise" and variations such as "comprises" or "comprising", will be understood to imply the inclusion of stated elements but not the exclusion of any other elements. In addition, throughout the specification, the word "on" does not necessarily mean that any element is positioned at an upper side based on a gravity direction, but means that any element is positioned above or below a target portion.

Hereinafter, an organic light emitting diode display according to an example embodiment will be described with reference to FIGS. 1 to 3.

Next, a pixel circuit of the organic light emitting diode display according to the present example embodiment will be described in more detail with reference to FIG. 1. Here, the pixel may mean a minimum unit displaying an image.

FIG. 1 is a circuit diagram illustrating a pixel of an organic light emitting diode display according to an example embodiment.

As illustrated in FIG. 1, a pixel Px of the organic light emitting diode display according to the present example embodiment includes a plurality of thin film transistors T1, T2, T3, T4, T5, T6, and T7, a plurality of wirings Sn, Sn-1, Sn-2, EM, Vin, DA, and ELVDD which are selectively connected to a plurality of thin film transistors T1, T2, T3, T4, T5, T6, and T7, a capacitor Cst, and an organic light emitting diode (OLED).

The plurality of thin film transistors T1, T2, T3, T4, T5, T6, and T7 includes a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 and the third thin film transistor T3 and a fourth drain electrode D4 of the fourth thin film transistor T4, respectively, a first source electrode S1 is connected to a second drain electrode D2 of the second thin film transistor T2 and a fifth drain electrode D5 of the fifth thin film transistor T5, and a first drain electrode D1 is connected to a third source electrode S3 of the third thin film transistor T3 and a sixth source electrode S6 of the sixth thin film transistor T6, respectively.

A second gate electrode G2 of the second thin film transistor T2 is connected to a first scan line Sn, the second source electrode S2 is connected to a data line DA, and the second drain electrode D2 is connected to the first source electrode S1 of the first thin film transistor T1.

A third gate electrode G3 of the third thin film transistor T3 is connected to the first scan line Sn, the third source electrode S3 is connected to the first drain electrode D1 of the first thin film transistor T1, and the third drain electrode D3 is connected to the first gate electrode G1 of the first thin film transistor T1.

A fourth gate electrode G4 of a fourth thin film transistor T4 is connected to a second scan line Sn-1, a fourth source electrode S4 is connected to an initialization power supply line Vin, and the fourth drain electrode D4 is connected to the first gate electrode G1 of the first thin film transistor T1.

A fifth gate electrode G5 of a fifth thin film transistor T5 is connected to an emission control line EM, the fifth source electrode T5 is connected to a driving power supply line ELVDD, and the fifth drain electrode D5 is connected to the first source electrode S1 of the first thin film transistor T1.

A sixth gate electrode G6 of a sixth thin film transistor T6 is connected to the emission control line EM and a sixth source electrode S6 is connected to the first drain electrode D1 of the first thin film transistor T1.

A seventh gate electrode G7 of a seventh thin film transistor T7 is connected to a third scan line Sn-2, a seventh source electrode S7 is connected to the organic light emitting diode (OLED), and a seventh drain electrode D7 is connected to the fourth source electrode S4 of the fourth thin film transistor T4.

The plurality of wirings includes a first scan line Sn which transfers first scan signals to a second gate electrode G2 and a third gate electrode G3 of a second thin film transistor T2 and third thin film transistor T3, respectively, a second scan line Sn-1 which transfers a second scan signal to a fourth gate electrode G4 of a fourth thin film transistor T4, a third scan line Sn-2 which transfers a third scan signal to a seventh gate electrode S7 of a seventh thin film transistor T7, an emission control line EM which transfers an emission control signal to a fifth gate electrode G5 and a sixth gate electrode G6 of a fifth thin film transistor T5 and a sixth thin film transistor T6, respectively, a data line (DA) which transfers a data signal to a second source electrode S2 of the second thin film transistor T2, a driving power supply line ELVDD which supplies driving signals to one electrode of a capacitor Cst and a fifth source electrode S5 of the fifth thin film transistor T5, respectively, and an initialization power supply line Vin which supplies an initialization signal to a fourth source electrode S4 of the fourth thin film transistor T4. Here, the data line DA and the driving power supply line ELVDD may be formed as a data wire.

The capacitor Cst includes one electrode which is connected to the driving power supply line ELVDD and another electrode which is connected to the first gate electrode G1 and a third drain electrode D3 of the third thin film transistor T3, respectively.

The organic light emitting diode OLED includes a first electrode, a second electrode positioned on the first electrode, and an organic emission layer positioned between the first electrode and the second electrode. The first electrode of the organic light emitting diode (OLED) is connected to the seventh source electrode S7 of the seventh thin film transistor T7 and the sixth drain electrode D6 of the sixth thin film transistor T6, respectively, and the second electrode is connected to a common power supply ELVSS to which the common signal is transferred.

As an example of driving of the pixel circuit, first, when the third scan signal is transferred to the third scan line Sn-2 to turn on the seventh thin film transistor T7, a residual current flowing in the first electrode of the organic light emitting diode (OLED) exits to the fourth thin film transistor T4 through the seventh thin film transistor T7, such that the organic light emitting diode (OLED) suppresses light from being unexpectedly emitted due to the residual current flowing in the first electrode of the organic light emitting diode (OLED).

Next, when the second scan signal is transferred to the second scan line Sn-1 and the initialization signal is transferred to the initialization power supply line Vin, the fourth thin film transistor T4 is turned on and thus an initialization voltage by the initialization signal is supplied to the first gate electrode G1 of the first thin film transistor T1 and the other electrode of the capacitor Cst through the fourth thin film transistor T4, such that the first gate electrode G1 and the capacitor Cst are initialized. In this case, the first thin film transistor T1 is turned on while the first gate electrode G1 is initialized.

Next, when the first scan signal is transferred to the first scan line Sn and the data signal is transferred to the data line DA, the second thin film transistor T2 and third thin film transistor T3 are each turned on to supply a data voltage Vd by the data signal to the first gate electrode G1 through the second thin film transistor T2, the first thin film transistor T1, and the third thin film transistor T3. In this case, as the voltage supplied to the first gate electrode G1, a compensation voltage {Vd+Vth, Vth is a negative (−) value}, which is reduced as much as the threshold voltage Vth of the first thin film transistor T1 from the data voltage Vd supplied from the first data line DA, is supplied. The compensation voltage Vd+Vth supplied to the first gate electrode G1 is supplied to the other electrode of the capacitor Cst which is connected to the first gate electrode G1.

Next, a driving voltage Vel by the driving signal is supplied from the driving power supply line ELVDD to one electrode of the capacitor Cst and the foregoing compensation voltage Vd+Vth is supplied to the other electrode thereof, and thus the capacitor Cst is stored with charge corresponding to a difference in the voltage applied to both electrodes, such that the first thin film transistor T1 is turned on for a predetermined time.

Next, when the emission control signal is applied to the emission control line EM, the fifth thin film transistor T5 and the sixth thin film transistor T6 are each turned on and thus the driving voltage Vel by the driving signal from the driving power supply line ELVDD is supplied to the first thin film transistor T1 through the fifth thin film transistor T5.

Then, a driving current Id which corresponds to a difference between the voltage supplied to the first gate electrode G1 and the driving voltage Vel by the capacitor Cst flows in the first drain electrode D1 of the first thin film transistor T1 while the driving voltage Vel passes through the first thin film transistor T1 which is turned on by the capacitor Cst and the driving current Id is supplied to the organic light emitting diode (OLED) through the sixth thin film transistor T6, such that the organic light emitting diode (OLED) emits light for a predetermined time.

The pixel circuit of the organic light emitting diode display according to the present example embodiment is configured to include the first thin film transistor T1 to the seventh thin film transistor T7, the capacitor Cst, the first scan line Sn to the third scan line Sn-2, the data line DA, the driving power supply line ELVDD, and the initialization power line Vin, but is not limited thereto and a pixel circuit of an organic light emitting diode display according to another example embodiment may be configured to include a plurality of thin film transistors which are at least two, at least on capacitor, and wirings including at least one scan line and at least one driving power supply line.

Next, an arrangement of pixels of the organic light emitting diode display according to an example embodiment as described above will be described in more detail with reference to FIGS. 2 and 3. Insulating layers are positioned between components which are positioned on different layers to be described below, in which the insulating layer may be an inorganic insulating layer or an organic insulating layer which may be made of silicon nitride, silicon oxide, or the like. Further, the insulating layers may be formed of a single layer or a multilayer.

Figure 2:
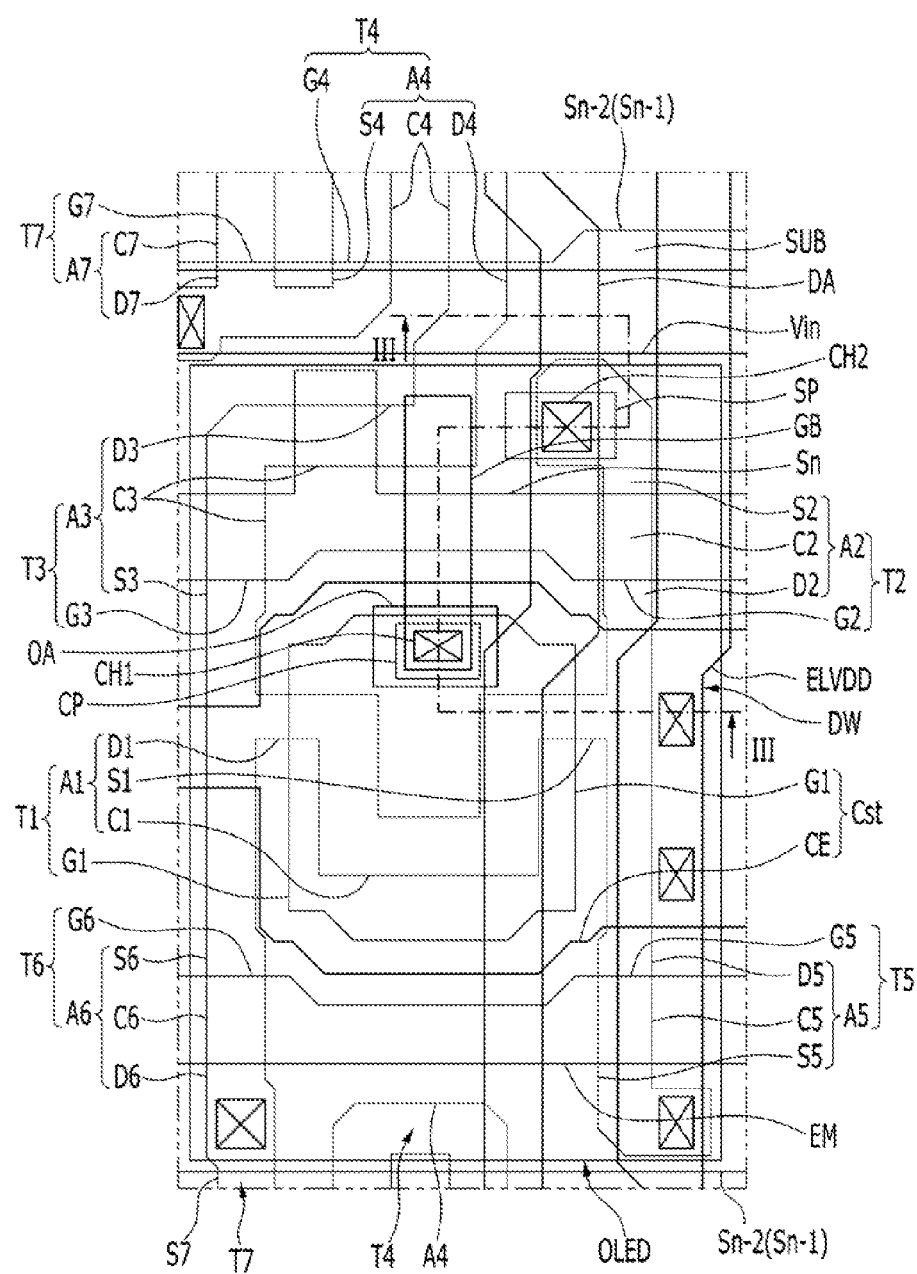
FIG. 2 illustrates a layout view illustrating the pixel of the organic light emitting diode display according to the present example embodiment.

FIG. 2 is a layout view illustrating the pixel of the organic light emitting diode display according to the present example embodiment. FIG. 3 is a cross-sectional view taken along line III-III of FIG. 2.

Figure 3:
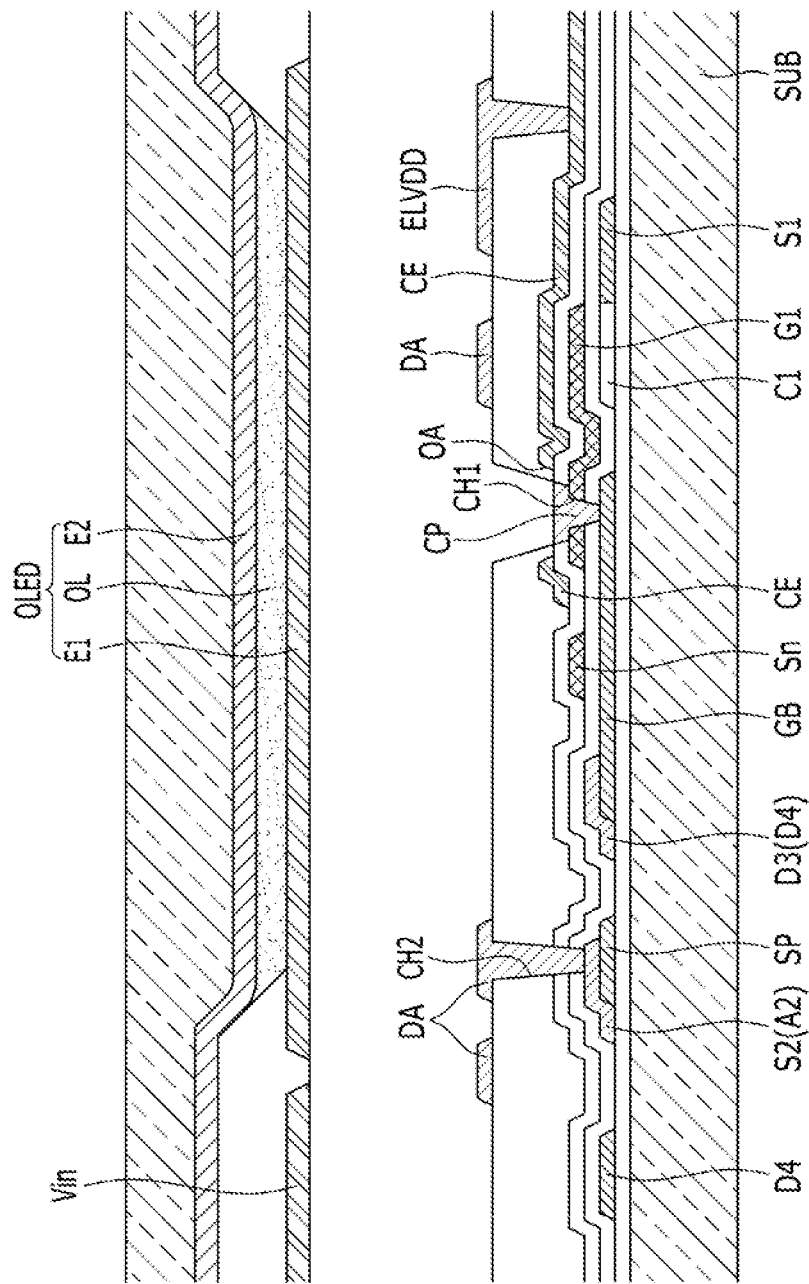
FIG. 3 illustrates a cross-sectional view taken along line III-III of FIG. 2.

As illustrated in FIGS. 2 and 3, the organic light emitting diode display according to the present example embodiment includes a substrate (SUB), the first thin film transistor T1, the gate bridge GB, a contact pattern CP, the second thin film transistor T2, a reinforcement pattern (SP), the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the emission control line EM, the capacitor Cst, the data line DA, the driving power supply line ELVDD, the initialization power line Vin, and the organic light emitting diode (OLED).

In FIG. 2, the second scan line Sn-1 and the third scan line Sn-2 are illustrated as one scan line, but are not limited thereto and the second scan line Sn-1 and the third scan line Sn-2 may be positioned as the respective scan lines which are separated apart from each other. The third scan line Sn-2 is the same line as the second scan line Sn-1 but is not limited thereto and the third scan line Sn-2 and the second scan line Sn-1 may be different lines.

The substrate SUB may be made of glass, quartz, ceramic, sapphire, plastic, metal, and the like, and may be flexible, stretchable, rollable, or foldable. The substrate (SUB) is flexible, stretchable, rollable, or foldable and thus the organic light emitting diode display may be is flexible, stretchable, rollable, or foldable on the whole.

The first thin film transistor T1 is positioned on the substrate (SUB) and includes the first active pattern A1 and the first gate electrode G1.

The first active pattern A1 includes the first source electrode S1, the first channel C1, and first drain electrode D1. The first source electrode S1 is connected to the second drain electrode D2 of the second thin film transistor T2 and the fifth drain electrode D5 of the fifth thin film transistor T5, respectively and the first drain electrode D1 is connected to the third source electrode S3 of the third thin film transistor T3 and the sixth source electrode S6 of the sixth thin film transistor T6, respectively. The first channel C1 which is a channel region of the first active pattern A1 overlapping the first gate electrode G1 is bent at least once and extends, and the first channel C1 is bent at least once and extends within a space overlapping the first gate electrode G1, which is a limited space, and thus the length of the first channel C1 may be formed to be long, such that a driving range of a gate voltage applied to the first gate electrode G1 may be formed to be wide. As a result, a magnitude of the gate voltage applied to the first gate electrode G1 is changed within the wide driving range to more delicately control gray levels of light emitted from the organic light emitting diode (OLED), thereby improving a quality of image which is displayed from the organic light emitting diode display. A shape of the first active pattern A1 may be variously changed and may be changed in various forms such as 'inverse S', 'S', 'M', and 'W'.

The first active pattern A1 may be made of poly-silicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), for example, a zinc oxide (ZnO), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), a hafnium-indium-zinc oxide (Hf—In—Zn—O), or other such composite oxides. When the first active pattern A1 is made of the oxide semiconductor, a separate passivation layer may be added in order to protect the oxide semiconductor vulnerable to an external environment such as exposure to a high temperature, or the like.

The first channel C1 of the first active pattern A1 may be channel-doped with N type impurities or P type impurities and the first source electrode S1 and the first drain electrode D1 are spaced apart from each other, having the first channel C1 therebetween and may each be doped with doping impurities having an opposite type to the doping impurities doped in the first channel C1.

The first gate electrode G1 is positioned on the first channel C1 of the first active pattern A1 and has an island shape. The first gate electrode G1 is connected to the gate bridge GB, which is positioned under the first gate electrode G1, through a first contact hole CH1. An inside of the first contact hole CH1 is provided with the contact pattern CP and the contact pattern CP contacts the first gate electrode G1 and the gate bridge GB, respectively, to connect between the first gate electrode G1 and the gate bridge GB. The first gate electrode G1 overlaps a capacitor electrode CE and may also serve as the other electrode of the capacitor Cst simultaneously with serving as the gate electrode of the first thin film transistor T1. The first gate electrode G1 forms the capacitor Cst, along with the capacitor electrode CE. The first gate electrode G1 may be made of metal.

According to the present example embodiment, the first contact hole CH1 is formed in the first gate electrode G1, but is not limited thereto and according to another example embodiment, the first contact hole may be formed only in the insulating layer positioned under the first gate electrode. In this case, the first gate electrode may direct contact the gate bridge through the first contact hole.

The gate bridge GB directly connects between the third active pattern A3 of the third thin film transistor T3 and the first gate electrode G1 and is positioned from between the substrate SUB and the third active pattern A3 to between the substrate SUB and the first gate electrode G1. The gate bridge GB directly contacts the third active pattern A3 and is connected to the first gate electrode G1 through the first contact hole CH1. In detail, the gate bridge GB is connected to the fourth drain electrode D4 of the fourth active pattern A4 of the fourth thin film transistor T4 and the third drain electrode D3 of the third active pattern A3 of the third thin film transistor T3 to be connected to the first gate electrode G1 of the first thin film transistor T1, such that the first gate electrode G1 of the first thin film transistor T1 is connected to the third drain electrode D3 of the third thin film transistor T3 and the fourth drain electrode D4 of the fourth thin film transistor T4, respectively.

The gate bridge GB may include materials different from those of the third active pattern A3, for example, metals such as gold, silver, and copper.

According to the present example embodiment, the gate bridge GB includes materials different from the third active pattern A3 but according to another example embodiment, the gate bridge may be integrally formed with the third active pattern to extend from the third active pattern to the first gate electrode direction.

Further, according to the present example embodiment, the gate bridge GB is positioned between the third active pattern A3 and the substrate SUB, but is not limited thereto and according to another example embodiment, the gate bridge may be positioned over the third active pattern.

The contact pattern CP is positioned inside the first contact hole CH1 and contacts the first gate electrode G1 and the gate bridge GB, respectively, to connect between the first gate electrode G1 and the gate bridge GB. The contact pattern CP is made of the same material as the data line DA and is positioned on the same layer as the data line DA but is not limited thereto, and therefore the contact pattern CP may be made of a material different from that of the data line DA or may be formed on a layer different from the data line DA.

The second thin film transistor T2 is positioned on the substrate (SUB) and includes the second active pattern A2 and the second gate electrode G2.

The second active pattern A2 includes the second source electrode S2, the second channel C2, and the second drain electrode D2. The second source electrode S2 is connected to the data line DA through the second contact hole CH2 formed on the insulating layer and the second drain electrode D2 is connected to the first source electrode S1 of the first thin film transistor T1. The second channel C2 which is a channel region of the second active pattern A2 overlapping the second gate electrode G2 is positioned between the second source electrode S2 and the second drain electrode D2. The second active pattern A2 is connected to the first active pattern A1.

The second channel C2 of the second active pattern A2 may be channel-doped with N type impurities or P type impurities and the second source electrode S2 and the second drain electrode D2 are spaced apart from each other, having the first channel C1 therebetween and may each be doped with doping impurities having an opposite type to the doping impurities doped in the first channel C1. The second active pattern A2 is positioned on the same layer as the first active pattern A1, made of the same material as the first active pattern A1, and integrally formed with the first active pattern A1.

The second gate electrode G2 is positioned on the second channel C2 of the second active pattern A2 and integrally formed with the first scan line Sn.

The reinforcement pattern SP is positioned between a portion corresponding to the contact hole CH2 of the second source electrode S2 of the second active pattern A2 and the substrate SUB.

The reinforcement pattern SP is positioned between the substrate SUB and the second active pattern A2, corresponding to the second contact hole CH2 an directly contacts the second active pattern A2. The reinforcement pattern SP may include the same material as the gate bridge GB, for example, metals such as gold, silver, and copper. The reinforcement pattern SP may be simultaneously formed with the gate bridge GB and may be positioned on the same layer as the gate bridge GB.

The third thin film transistor T3 is positioned on the substrate SUB and includes the third active pattern A3 and the second gate electrode G3.

The third active pattern A3 includes the third source electrode S3, the third channel C3, and the third drain electrode D3. The third source electrode S3 is connected to the first drain electrode D1 and the third drain electrode D3 is connected to the first gate electrode G1 of the first thin film transistor T1 by the gate bridge GB. The third channel C3 which is a channel region of the third active pattern A3 overlapping the third gate electrode G3 is positioned between the third source electrode S3 and the third drain electrode D3. The third active pattern A3 connects between the first active pattern A1 and the first gate electrode G1.

The third channel C3 of the third active pattern A3 may be channel-doped with N type impurities or P type impurities and the third source electrode S3 and the third drain electrode D3 are spaced apart from each other, having the third channel C3 therebetween and may each be doped with doping impurities having an opposite type to the doping impurities doped in the third channel C3. The third active pattern A3 is positioned on the same layer as the first active pattern A1 and the second active pattern A2, made of the same material as the first active pattern A1 and the second active pattern A2, and integrally formed with the first active pattern A1 and the second active pattern A2.

The third gate electrode G3 is positioned on the third channel C3 of the third active pattern A3 and integrally formed with the first scan line Sn. The third gate electrode G3 is formed as a dual gate electrode.

The fourth thin film transistor T4 is positioned on the substrate (SUB) and includes a fourth active pattern A4 and the fourth gate electrode G4.

The fourth active pattern A4 includes the fourth source electrode S4, the fourth channel C4, and the fourth drain electrode D4. The fourth source electrode S4 is connected to the initialization power supply line Vin through the contact hole and the fourth drain electrode D4 is connected to the first gate electrode G1 of the first thin film transistor T1 by the gate bridge GB. The fourth channel C4 which is a channel region of the fourth active pattern A4 overlapping the fourth gate electrode G4 is positioned between the fourth source electrode S4 and the fourth drain electrode D4. The fourth active pattern A4 is connected to the third active pattern A3 and the first gate electrode G1, respectively, simultaneously with connecting between the initialization power line Vin and the first gate electrode G1.

The fourth channel C4 of the fourth active pattern A4 may be channel-doped with N type impurities or P type impurities and the fourth source electrode S4 and the fourth drain electrode D4 are spaced apart from each other, having the fourth channel C4 therebetween and may each be doped with doping impurities having an opposite type to the doping impurities doped in the fourth channel C4. The fourth active pattern A4 is positioned on the same layer as the first active pattern A1, the second active pattern A2, the third active pattern A3, made of the same material as the first active pattern A1, the second active pattern A2, and the third active pattern A3, and integrally formed with the first active pattern A1, the second active pattern A2, and the third active pattern A3.

The fourth gate electrode G4 is positioned on the fourth channel C4 of the fourth active pattern A4 and integrally formed with the second scan line Sn-1. The fourth gate electrode G4 is formed as a dual gate electrode.

The fifth thin film transistor T5 is positioned on the substrate (SUB) and includes a fifth active pattern A5 and the fifth gate electrode G5.

The fifth active pattern A5 includes the fifth source electrode S5, the fifth channel C5, and the fifth drain electrode D5

The fifth source electrode S5 is connected to the driving power supply line ELVDD through the contact hole and the fifth drain electrode D5 is connected to the first source electrode S1 of the first thin film transistor T1. The fifth channel G5, which is a channel region of the fifth active pattern A5 overlapping the fifth gate electrode G5, is positioned between the fifth source electrode S5 and the fifth drain electrode D5. The fifth active pattern A5 connects between the driving power supply line ELVDD and the first active pattern A1.

The fifth channel C5 of the fifth active pattern A5 may be channel-doped with N type impurities or P type impurities and the fifth source electrode S5 and the fifth drain electrode D5 are spaced apart from each other, having the fifth channel C5 therebetween, and may each be doped with doping impurities having an opposite type to the doping impurities doped in the fifth channel C5. The fifth active pattern A5 is positioned on the same layer as the first active pattern A1, the second active pattern A2, the third active pattern A3, and the fourth active pattern A4, made of the same material as the first active pattern A1, the second active pattern A2, the third active pattern A3, and the fourth active pattern A4, and integrally formed with the first active pattern A1, the second active pattern A2, the third active pattern A3, and the fourth active pattern A4.

The fifth gate electrode G5 is positioned on the fifth channel C5 of the fifth active pattern A5 and integrally formed with the emission control line EM.

The sixth thin film transistor T6 is positioned on the substrate (SUB) and includes the sixth active pattern A6 and the sixth gate electrode G6.

The sixth active pattern A6 includes the sixth source electrode S6, the sixth channel C6, and the sixth drain electrode D6. The sixth source electrode S6 is connected to the first drain electrode D1 of the first thin film transistor T1 and the sixth drain electrode D6 is connected to the first electrode E1 of the organic light emitting diode (OLED) through the contact hole. The sixth channel C6 which is a channel region of the sixth active pattern A6 overlapping the sixth gate electrode G6 is positioned between the sixth source electrode S6 and the sixth drain electrode D6. The sixth active pattern A6 connects between the first active pattern A1 and the first electrode E1 of the organic light emitting diode (OLED).

The sixth channel C6 of the sixth active pattern A6 may be channel-doped with N type impurities or P type impurities and the sixth source electrode S6 and the sixth drain electrode D6 are spaced apart from each other, having the sixth channel C6 therebetween, and may each be doped with doping impurities having an opposite type to the doping impurities doped in the sixth channel C6. The sixth active pattern A6 is positioned on the same layer as the first active pattern A1, the second active pattern A2, the third active pattern A3, the fourth active pattern A4, and the fifth active pattern A5, made of the same material as the first active pattern A1, the second active pattern A2, the third active pattern A3, the fourth active pattern A4, and the fifth active pattern A5, and integrally formed with the first active pattern A1, the second active pattern A2, the third active pattern A3, the fourth active pattern A4, and the fifth active pattern A5.

The sixth gate electrode G6 is positioned on the sixth channel C6 of the sixth active pattern A6 and integrally formed with the emission control line EM.

The seventh thin film transistor T7 is positioned on the substrate (SUB) and includes the seventh active pattern A7 and the seventh gate electrode G7.

The seventh active pattern A7 includes the seventh source electrode S7, the seventh channel C7, and the seventh drain electrode D7

The seventh source electrode S7 is connected to the first electrode of the organic light emitting diode of another pixel (pixel positioned over the pixel of FIG. 2), and the seventh drain electrode D7 is connected to the fourth source electrode S4 of the fourth thin film transistor T4. The seventh channel C7 which is a channel region of the seventh active pattern A7 overlapping the seventh gate electrode G7 is positioned between the seventh source electrode S7 and the seventh drain electrode D7. The seventh active pattern A7 connects between the first electrode and the fourth active pattern A4 of the organic light emitting diode.

The seventh channel C7 of the seventh active pattern A7 may be channel-doped with N type impurities or P type impurities and the seventh source electrode S7 and the seventh drain electrode D7 are spaced apart from each other, having the seventh channel C7 therebetween and may each be doped with doping impurities having an opposite type to the doping impurities doped in the seventh channel C7. The seventh active pattern A7 is positioned on the same layer as the first active pattern A1, the second active pattern A2, the third active pattern A3, the fourth active pattern A4, the fifth active pattern A5, and the sixth active pattern A6, made of the same material as the first active pattern A1, the second active pattern A2, the third active pattern A3, the fourth active pattern A4, the fifth active pattern A5, and the sixth active pattern A6, and integrally formed with the first active pattern A1, the second active pattern A2, the third active pattern A3, the fourth active pattern A4, the fifth active pattern A5, and the sixth active pattern A6.

The seventh gate electrode G7 is positioned on the seventh channel C7 of the seventh active pattern A7 and integrally formed with the third scan line Sn-2.

The first scan line Sn is positioned on the second active pattern A2 and the third active pattern A3 to extend in one direct crossing the second active pattern A2 and the third active pattern A3 and connected to the second gate electrode G2 and the third gate electrode G3, being integrally formed with the second gate electrode G2 and the third gate electrode G3.

The second scan line Sn-1 is positioned on the fourth active pattern A4, being spaced apart from the first scan line Sn and extends in one direction crossing the fourth active pattern A4 and connected to the fourth gate electrode G4, being integrally formed with the fourth gate electrode G4. The second scan line Sn-1 is the same line as the third scan line Sn-2 but is not limited thereto and may be formed as a different line from the third scan line Sn-2.

The third scan line Sn-2 is positioned on the seventh active pattern A7, being spaced apart from the first scan line Sn and extends in one direction crossing the seventh active pattern A7 and connected to the seventh gate electrode G7, being integrally formed with the seventh gate electrode G7. The third scan line Sn-2 is the same line as the second scan line Sn-1 but is not limited thereto and may be formed as a different line from the second scan line Sn-1.

The emission control line EM is positioned on the fifth active pattern A5 and the sixth active pattern A6, being spaced apart from the first scan line Sn and extends in one direction crossing the fifth active pattern A5 and the sixth active pattern A6 and is connected to the fifth gate electrode G5 and the sixth gate electrode G6, being integrally formed with the fifth gate electrode G5 and the sixth gate electrode G6.

As described above, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 are positioned on the same layer and made of the same material. For example, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 may form the first gate wire.

According to another example embodiment, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 each are selectively positioned on different layers and made of different materials.

The capacitor Cst includes one electrode and another electrode which face each other, having the insulating layer therebetween. The one electrode may be the capacitor electrode CE and the other electrode may be the first gate electrode G1. The capacitor electrode CE is positioned on the first gate electrode G1 and is connected to the driving power supply line ELVDD through the contact hole. The capacitor electrode CE overlaps the first gate electrode G1 on the first gate electrode G1.

The capacitor electrode CE forms the capacitor Cst along with the first gate electrode G1 and the first gate electrode G1 and the capacitor electrode CE are each made of different metals and the same metal on different layers. The capacitor electrode CE extends in one direction and crosses a plurality of pixels Pxs which are adjacent to each other. The capacitor electrode CE may be formed of a second gate wire which is positioned on the above-mentioned first gate wire.

The capacitor electrode CE includes an opening OA through which the first contact hole CH1 of the first gate electrode G1 is exposed and the contact pattern CP including the same material through the data line DA may be inside the first contact hole CH1 through the opening OA.

The data line DA is positioned on the first scan line Sn and extends in the other direction crossing the first scan line Sn. The data line DA is connected to the second source electrode S2 of the second active pattern A2 through the second contact hole CH2. The data line DA extends crossing the first scan line Sn, the second scan line Sn-1, the third scan line Sn-2, and the emission control line EM.

The driving power supply line ELVDD is positioned on the first scan line Sn which is adjacent to the data line DA and extends in the other direction crossing the first scan line Sn. The driving power supply line ELVDD is connected to the capacitor electrode CE and the fifth source electrode S5 of the fifth active pattern A5 connected to the first active pattern A1 through the contact hole. The driving power supply line ELVDD extends crossing the first scan line Sn, the second scan line Sn-1, the third scan line Sn-2, and the emission control line EM.

As described above, the data line DA and the driving power supply line ELVDD, each are positioned on the same layer and made of the same material to form the data wire.

According to another example embodiment, the data line DA and the driving power supply line ELVDD each are selectively positioned on different layers and may be made of different materials.

The initialization power line Vin is positioned on the second scan line Sn-1 and is connected to the fourth source electrode S4 of the fourth active pattern A4 through the contact hole. The initialization power line Vin is positioned on the same layer as the first electrode E1 of the organic light emitting diode (OLED) and is made of the same material. According to another example embodiment, the initialization power line Vin is positioned on a different layer from the first electrode E1 and may be made of different materials.

The organic light emitting diode (OLED) includes the first electrode E1, an organic light emitting layer OL, and the second electrode E2. The first electrode E1 is connected to the sixth drain electrode D6 of the sixth thin film transistor T6 through the contact hole. The organic light emitting layer OL is positioned between the first electrode E1 and the second electrode E2. The second electrode E2 is positioned on the organic light emitting layer OL. At least one of the first electrode E1 and the second electrode E2 may be any one of a light transmitting electrode, a light reflective electrode, and a light translucent electrode and light emitted from the organic light emitting layer OL may emitted in at least any one direction of the first electrode E1 and the second electrode E2.

A capping layer covering the organic light emitting diode (OLED) may be positioned on the organic light emitting diode (OLED) and a thin film encapsulation may be positioned or an encapsulation substrate may be positioned on the organic light emitting diode (OLED), having the capping layer therebetween.

As described above, in the organic light emitting diode display according to the present example embodiment, the gate bridge GB is positioned between the third active pattern A3 and the substrate SUB to contact the third active pattern A3, such that there is no need to form the contact hole on the third active pattern A3, thereby preventing a portion of the third active pattern A3 from being damaged due to the etching process of forming the contact hole corresponding to the third active pattern A3.

Further, according to the organic light emitting diode display according to the present example embodiment, the second contact hole CH2 is formed to correspond to the second active pattern A2 so as to make the data line DA contact the second active pattern A2, and as a result, even if a portion of the second active pattern A2 is damaged by the etching process of forming the second contact hole CH2, the reinforcement pattern SP contacting the second active pattern A2 is positioned between the substrate SUB which is the lower portion of the second active pattern A2 and the second active pattern A2, corresponding to the second contact hole CH2, thereby suppressing the connection between the data line DA and the second active pattern A2 from being separated through the second contact hole CH2.

According to the organic light emitting device according to the present example embodiment, the gate bridge GB contacts the third active pattern A3 at the lower portion of the third active pattern A3, and therefore there is no need to form the contact corresponding to the third active pattern A3. As a result, there is no need to increase the area of the third active pattern A3, corresponding to the position where the contact hole is formed, and therefore the high-resolution pixel circuit may be easily implemented in the limited space.

Further, according to the organic light emitting diode display according to the present example embodiment, the reinforcement pattern SP is positioned at the lower portion of the second active pattern A2, corresponding to the second contact hole CH2, and therefore there is no need to increase the area of the second active pattern A2, corresponding to the second contact hole CH2. As such, there is no need to increase the area of the second active pattern A2, corresponding to the second contact hole CH2, and therefore the high-resolution pixel circuit may be easily implemented in the limited space.

Further, according to the organic light emitting diode display according to the present example embodiment, even though one pixel Px is formed of 7 thin film transistors and one capacitor, and the number of wirings passing through the one pixel wiring is increased and an interval between the wirings is narrow correspondingly, the gate bridge GB and the data line DA which are adjacent to each other in two dimensions are each positioned on different layers, thereby suppressing a crosstalk from unexpectedly occurring between the gate bridge GB and the data line DA.

As a result, since it is suppressed that a signal passing through the data line DA and the gate bridge GB, respectively, is delayed, the organic light emitting diode display with an improved quality of image on the whole is provided.

Further, according to the organic light emitting device according to the present example embodiment, the gate bridge GB is positioned between the first gate electrode G1 and the substrate SUB, and thus the first gate electrode G1 is positioned between the gate bridge GB and the capacitor electrode CE and the insulating layer is positioned between the respective components, and thus the gate bridge GB is far away from the capacitor electrode CE, such that the short-circuit between the capacitor electrode CE and the gate bridge GB may be suppressed.

By way of summation and review, an organic light emitting diode display includes a plurality of thin film transistors, a capacitor, and a plurality of wirings. The organic light emitting diode display may be manufactured to have a high resolution and a large area, and thus the number of thin film transistors configuring one pixel which is a minimum unit displaying an image is increased, such that active patterns included in a plurality of thin film transistors, respectively, are connected to each other. The active pattern of at least one thin film transistor selected from the plurality of thin film transistors contacts a data wiring through a contact hole.

As described above, embodiments relate to an organic light emitting diode display including a plurality of thin film transistors. Embodiments may provide an organic light emitting diode device having advantages of suppressing an active pattern from being damaged due to a process of forming a contact hole corresponding to the active pattern. Embodiments may provide an organic light emitting diode device capable of suppressing an active pattern from being damaged due to a process of forming a contact hole corresponding to the active pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light emitting diode display, comprising:
a substrate;
a first thin film transistor including a first active pattern positioned on the substrate and a first gate electrode positioned on the first active pattern;
a second thin film transistor including a second active pattern connected to one end of the first active pattern and a second gate electrode positioned on the second active pattern;
a data line positioned on the second gate electrode and connected to the second active pattern through a contact hole;
a third thin film transistor including a third active pattern connected to another end of the first active pattern and a third gate electrode positioned on the third active pattern;
a gate bridge directly connecting between the third active pattern and the first gate electrode; and
an organic light emitting diode connected to the first active pattern,
wherein the gate bridge is disposed between the substrate and the third active pattern.

2. The organic light emitting diode display as claimed in claim 1, wherein the gate bridge directly connects to the third active pattern and is connected to the first gate electrode through the contact hole.

3. The organic light emitting diode display as claimed in claim 2, further comprising a contact pattern positioned inside the contact hole and contacting the first gate electrode and the gate bridge, respectively.

4. The organic light emitting diode display as claimed in claim 3, wherein the contact pattern is positioned on a same layer as the data line.

5. The organic light emitting diode display as claimed in claim 1, further comprising a reinforcement pattern positioned between the substrate and the second active pattern, corresponding to the contact hole.

6. The organic light emitting diode display as claimed in claim 5, wherein the reinforcement pattern directly contacts the second active pattern.

7. The organic light emitting diode display as claimed in claim 5, wherein the reinforcement pattern is positioned on a same layer as the gate bridge.

8. The organic light emitting diode display as claimed in claim 1, further comprising:
a first scan line positioned on the second active pattern, crossing the second active pattern and the third active pattern, respectively, and connected to the second gate electrode and the third gate electrode; and
a driving power supply line crossing the first scan line, being adjacent to the data line on the first scan line and connected to the first active pattern.

9. The organic light emitting diode display as claimed in claim 8, further comprising a capacitor electrode connected to the driving power supply line to be positioned on the first gate electrode and forming the capacitor together with the first gate electrode, overlapping the first gate electrode.

10. The organic light emitting diode display as claimed in claim 9, wherein the first gate electrode and the capacitor electrode are each made of metal.

11. The organic light emitting diode display as claimed in claim 8, wherein:
the first active pattern, the second active pattern, and the third active pattern are each positioned on a same layer, and
the data line and the driving power supply line are each positioned on a same layer.

12. The organic light emitting diode display as claimed in claim 8, further comprising:
a fourth thin film transistor connected to the third active pattern and including a fourth active pattern connected to the first gate electrode through the gate bridge and a fourth gate electrode positioned on the fourth active pattern;
a second scan line positioned on the fourth active pattern to cross the fourth active pattern and connected to the fourth gate electrode; and
an initialization power supply line connected to the fourth active pattern.

13. The organic light emitting diode display as claimed in claim 12, wherein the first gate electrode, the second gate electrode, the third gate electrode, the fourth gate electrode, the first scan line, and the second scan line are each positioned on a same layer.

14. The organic light emitting diode display as claimed in claim 12, further comprising:
a fifth thin film transistor including a fifth active pattern connecting between the first active pattern and the driving power supply line and a fifth gate electrode positioned on the fifth active pattern;
a sixth thin film transistor including a sixth active pattern connecting between the first active pattern and the organic light emitting diode and a sixth gate electrode positioned on the sixth active pattern; and
an emission control line positioned on the fifth active pattern and the sixth active pattern, respectively, to cross the fifth active pattern and the sixth active pattern, respectively, and connected to the fifth gate electrode and the sixth gate electrode, respectively.

15. The organic light emitting diode display as claimed in claim 14, wherein the first gate electrode, the second gate electrode, the third gate electrode, the fourth gate electrode, the fifth gate electrode, the sixth gate electrode, and the emission control line are each positioned on a same layer.

16. The organic light emitting diode display as claimed in claim 12, further comprising:
a seventh thin film transistor including a seventh active pattern connected to the fourth active pattern and a seventh gate electrode positioned on the seventh active pattern; and
a third scan line positioned on the seventh active pattern to cross the seventh active pattern and connected to the seventh gate electrode.

17. The organic light emitting diode display as claimed in claim 16, wherein the third scan line is the same line as the second scan line.

18. The organic light emitting diode display as claimed in claim 1, wherein a channel region of the first active pattern overlapping the first gate electrode extends with one or more bends.

* * * * *